United States Patent
Kawamoto et al.

(10) Patent No.: US 6,890,449 B2
(45) Date of Patent: May 10, 2005

(54) METHOD FOR MANUFACTURING PRINTED-CIRCUIT BOARD

(75) Inventors: Eiji Kawamoto, Ibaraki (JP); Shigeru Yamane, Hirakata (JP); Toshiaki Takenaka, Soraku-gun (JP); Toshihiro Nishii, Hirakata (JP)

(73) Assignee: Matsushita Electric Industrial Co., Ltd. (JP)

(*) Notice: Subject to any disclaimer, the term of this patent is extended or adjusted under 35 U.S.C. 154(b) by 228 days.

(21) Appl. No.: 10/048,927

(22) PCT Filed: Jun. 5, 2001

(86) PCT No.: PCT/JP01/04754

§ 371 (c)(1),
(2), (4) Date: Jun. 7, 2002

(87) PCT Pub. No.: WO01/95678

PCT Pub. Date: Dec. 13, 2001

(65) Prior Publication Data

US 2002/0170876 A1 Nov. 21, 2002

(30) Foreign Application Priority Data

Jun. 5, 2000 (JP) .................................... 2000-167263

(51) Int. Cl.⁷ ........................ H01K 13/00; H05K 3/36
(52) U.S. Cl. ............................................ 216/18; 29/830
(58) Field of Search ........................... 216/13, 17, 18, 216/39; 174/264; 361/748; 29/825, 829, 830

(56) References Cited

U.S. PATENT DOCUMENTS 5,067,859 A * 11/1991 Korbonski ............... 408/1 R

FOREIGN PATENT DOCUMENTS

| EP | 0 723 388 A1 | 7/1996 |
|---|---|---|
| JP | 1-281795 | 11/1989 |
| JP | 8-255982 | 10/1996 |
| JP | 2601128 | 1/1997 |
| JP | 9-246718 | 9/1997 |
| JP | 11-74640 | 3/1999 |
| JP | 11-074640 | 3/1999 |
| JP | 11-298105 | 10/1999 |

* cited by examiner

*Primary Examiner*—Gregory Mills
*Assistant Examiner*—Roberts Culbert
(74) *Attorney, Agent, or Firm*—Parkhurst & Wendel, L.L.P.

(57) ABSTRACT

A method of manufacturing a PCB comprising the steps of: forming through-holes in a substrate having releasing layers on front and back faces; filling conductive paste in the through-holes; removing the releasing layers and disposing metal foil on both faces of the substrate; and heat pressing them. A diameter of the through-holes is larger than that of corresponding holes formed on the releasing layers. According to the present invention, when the conductive paste is compressed, conductive paste protruding from the surface of the substrate is trapped at the edges of the through-holes. This configuration prevents short circuits with undesirable wiring patterns. So, an enough amount of the conductive paste can protrude from the surface of the substrate. Therefore, after the compression, stable electric connections inside the conductive paste and between the conductive paste and the metal foils are ensured, thus PCBs with superior reliability can be produced.

12 Claims, 8 Drawing Sheets

(a)

(b)

(c)

(d)

(a)

(b)

(c)

(d)

METHOD FOR MANUFACTURING PRINTED-CIRCUIT BOARD

FIELD OF THE INVENTION

The present invention relates to a printed circuit board to be used for electronic devices.

BACKGROUND OF THE INVENTION

Electronic devices of recent years have been increasingly miniaturized, reduced in weight and advanced in functionality. Against this backdrop, the trend toward multi-layered, high-density printed circuit boards (hereinafter, PCB) has been gathering its momentum. A PCB is typically produced by alternately stacking a plurality of substrates with conductive circuits formed thereon and prepreg sheets (so-called "prepreg"), bonding them under heat and pressure, forming through-holes, and plating them with copper or other metallic materials to provide an electrical connection between the surface and inner layers.

Due to an intensified demand for video cameras and mobile telecommunication devices, however, PCBs used for such devices have been ever more strongly required to be lighter, thinner and high density. In response to such demand, a manufacturing method for a new kind of PCB disclosed in Japanese Patent No. 2601128 has been put into practical application. The manufacturing method of this PCB comprises the steps of:

1. forming through-holes on a porous compressible substrate sandwiched between releasing films;
2. filling the through-holes with conductive paste;
3. removing the releasing films;
4. placing metal foils on both sides of the porous substrate and compress the laminate under heat to provide an electrical connection; and
5. etching the metal foils to form circuitry.

The configuration of the foregoing conventional PCB is described with reference to the attached drawings. FIGS. 8(a)–(g) are sectional view showing the manufacturing process of the conventional PCB. As FIG. 8(a) shows, a porous substrate (hereinafter, prepreg) 11 whose dimensions are 500 mm square and $T_1$ mm in thickness, sandwiched between releasing films 12, is prepared. As the prepreg 11, a composite material produced by impregnating thermosetting epoxy resin into non-woven fabric made of aromatic polyamide fiber is used.

Successively, as FIG. 8(b) shows, through-holes 13 are formed at the predetermined places of the prepreg 11 by a laser machining method.

The prepreg 11 is then placed on a table of a printer (not illustrated), and conductive paste 14 is printed on the releasing films 12 to fill the through-holes 13 as FIG. 8(c) shows. In this process, the releasing film 12 coating the top face of the prepreg 11, acts as a printing mask and an anti-contamination material for the prepreg 11.

Successively, as shown in FIG. 8(d), the releasing films 12 coating both faces of the prepreg 11 are removed at room temperature. Metal foils 15 made of copper or other metals are attached to both faces of the prepreg 11 as shown in FIG. 8(e). The laminate is then pressed under heat to adhere the prepreg 11 and the metal foils 15 as illustrated in FIG. 8(f). Simultaneously, in this process the prepreg 11 is compressed to $T_2$ mm in thickness ($T_1 > T_2$) to electrically connect the metal foils 15 on both of its faces with the conductive paste 14.

During this step, the epoxy resin composing the prepreg 11 and the conductive paste 14 are cured. In order to lower connection resistance between the conductive paste 14 and the metal foils 15, as disclosed in the U.S. Pat. No. 2,587,596, after filling the conductive paste 14 and removing the releasing films 12, the prepreg 11 is provided with protrusions of the conductive paste on both of its faces (see FIG. 8(d)).

If the conductive paste 14 protrudes from the top and bottom faces of the prepreg 11 as disclosed in this method, the protrusions allow the conductive paste 14 to be compressed more and become denser than a method without protrusion when the metal foil 15 and the prepreg 11 are pressed under heat. Therefore each of metal powders contained in the conductive paste 14 contact in larger area with each other and with the metal foils 15 placed on both front and back faces of the prepreg 11. This results in lower resistance in the connection.

Successively, as shown in FIG. 8(g), after the metal foils 15 are provided with patterns by photo lithography, both of the metal foils 15 on cured faces of the prepreg 11 are etched to form wiring patterns 16.

According to the conventional configuration, however, when compressed, the conductive paste protruding from the prepreg fails to be kept in the through-holes and overflows from them, and connects to other wiring patterns to trigger a short circuit.

The present invention aims to address the foregoing problems, and providing a PCB which achieves a reliable electrical connection between the conductive paste and the metal foils disposed on both faces of the prepreg. The PCB of the present invention allows the conductive paste to be filled into the through-holes properly, and even when the wiring patterns has high density, avoids short circuits triggered by connection between the conductive paste and an undesignated wiring pattern.

DISCLOSURE OF THE INVENTION

The method of manufacturing the PCB of the present invention comprises the steps of:

1) forming through-holes in the substrate having releasing layers formed its front and back faces;
2) filling conductive paste in the through-holes;
3) removing the releasing layers and disposing metal foils on front and back faces of the substrate; and
4) curing resin material under pressure and heat to adhere the metal foils and the substrate.

Wherein, a diameter of the through-holes formed on the front and the back faces of the substrate of the PCB is larger than that of corresponding holes formed on the releasing layers.

According to the manufacturing method of the present invention, when the conductive paste is compressed, flow of the conductive paste protruding from the surface of the substrate is trapped at the edges of the through-holes. This configuration prevents short circuits with other wiring patterns from occurring, and allows adequate conductive paste to protrude from the surface of the substrate. Therefore, even after the compression of the substrate, electric connections inside the conductive paste and between the conductive paste and the metal foil are ensured, thus, the present invention provides PCBs with superior reliability.

DESCRIPTION OF THE PREFERRED ENBODIMENT

Figure 1:
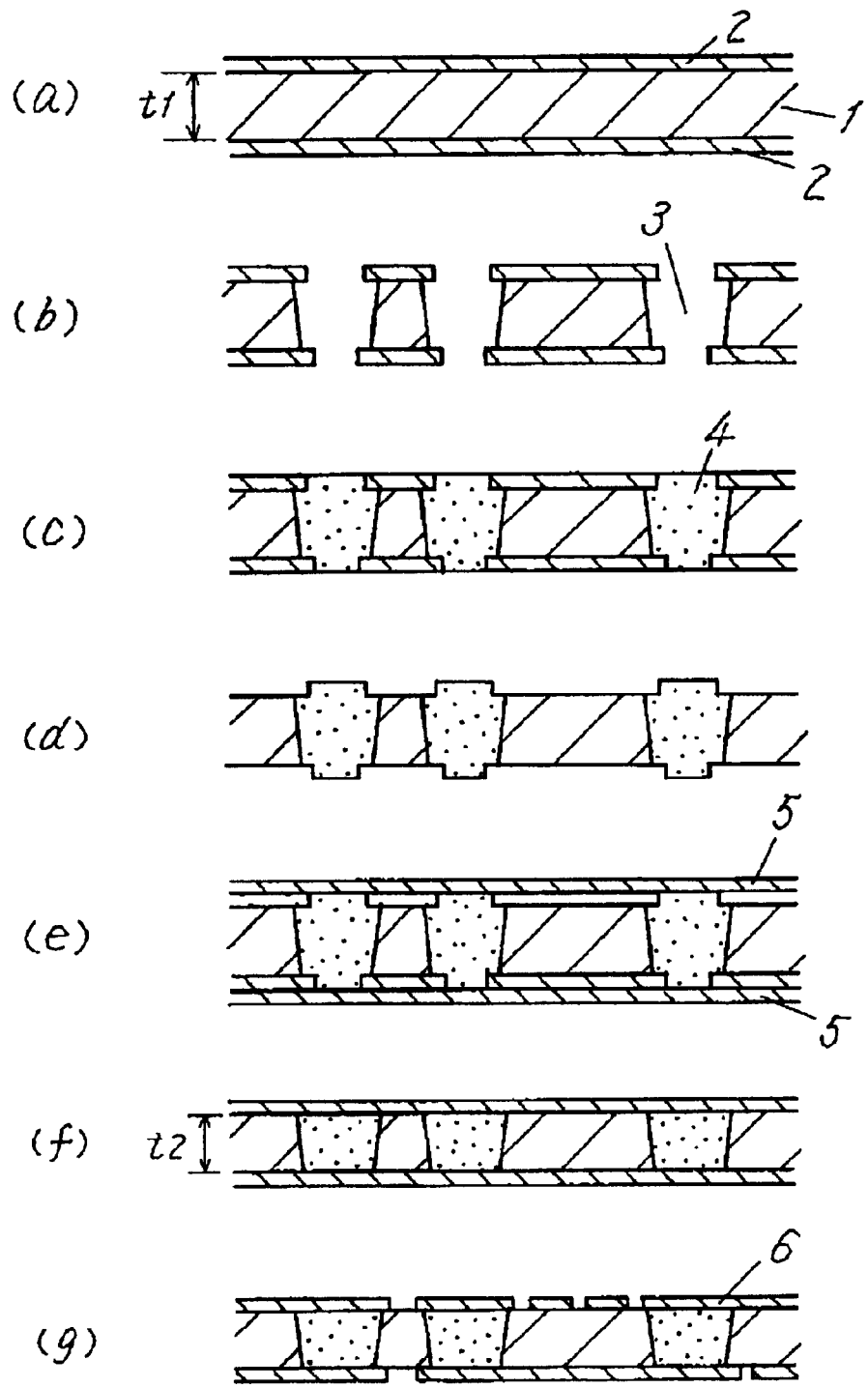
FIG. 1 shows sectional views illustrating manufacturing process of PCB in accordance with a first embodiment of the present invention.
Figure 2:
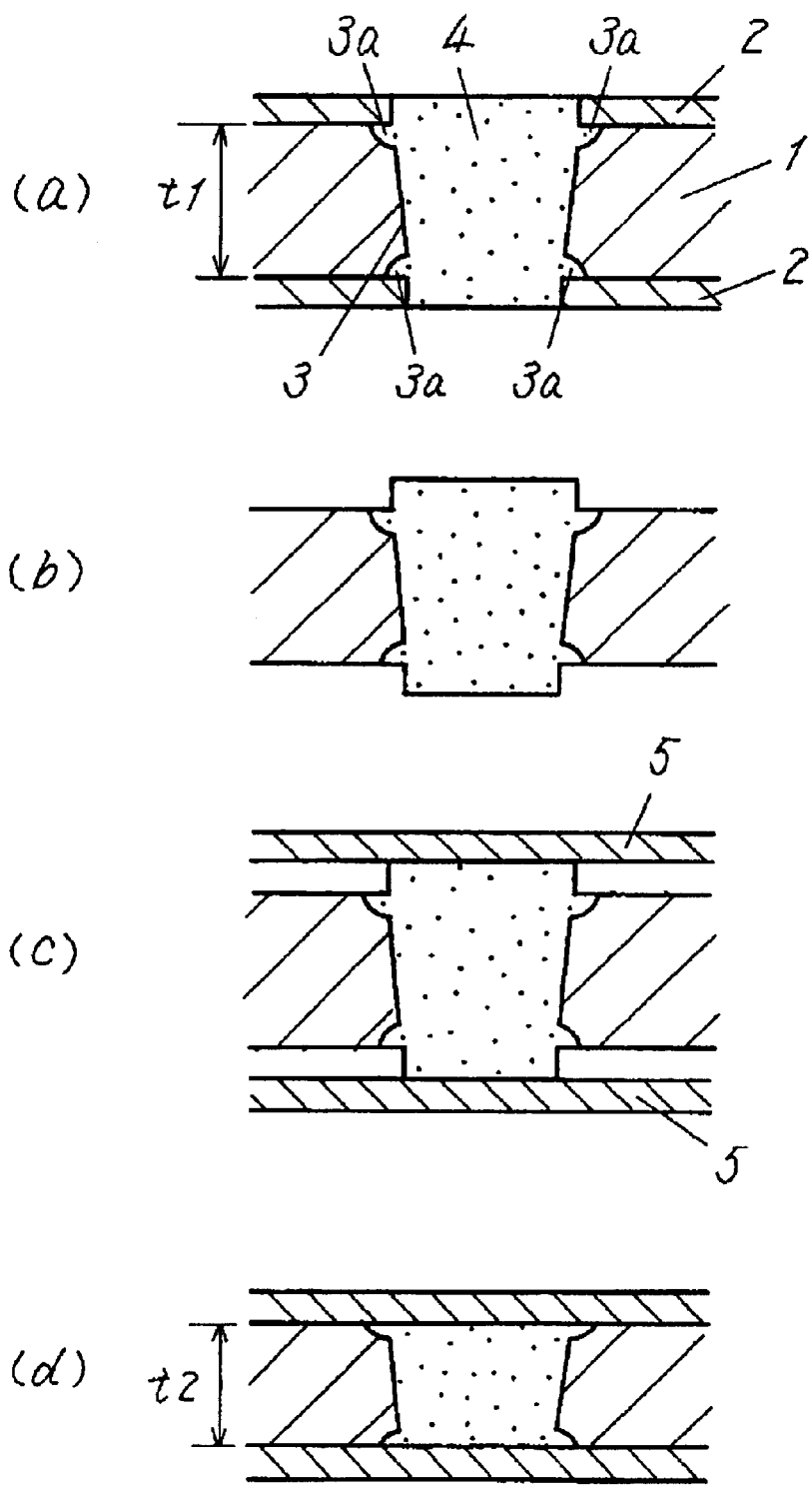
FIG. 2 shows sectional views illustrating the manufacturing process of the through-holes in accordance with a second embodiment of the present invention.
Figure 3:
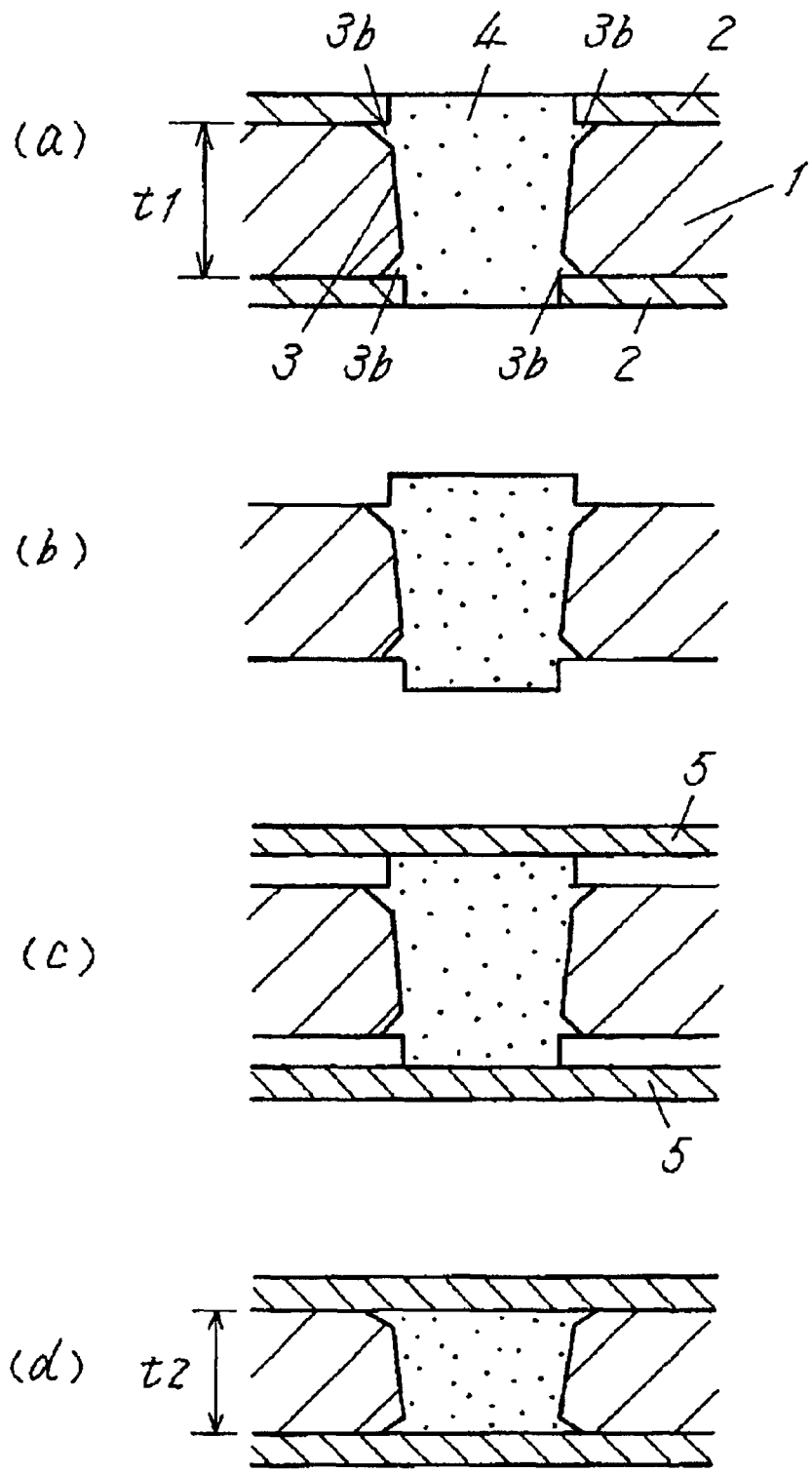
FIG. 3 shows sectional views illustrating the manufacturing process of the through-holes in accordance with a third embodiment of the present invention.
Figure 4:
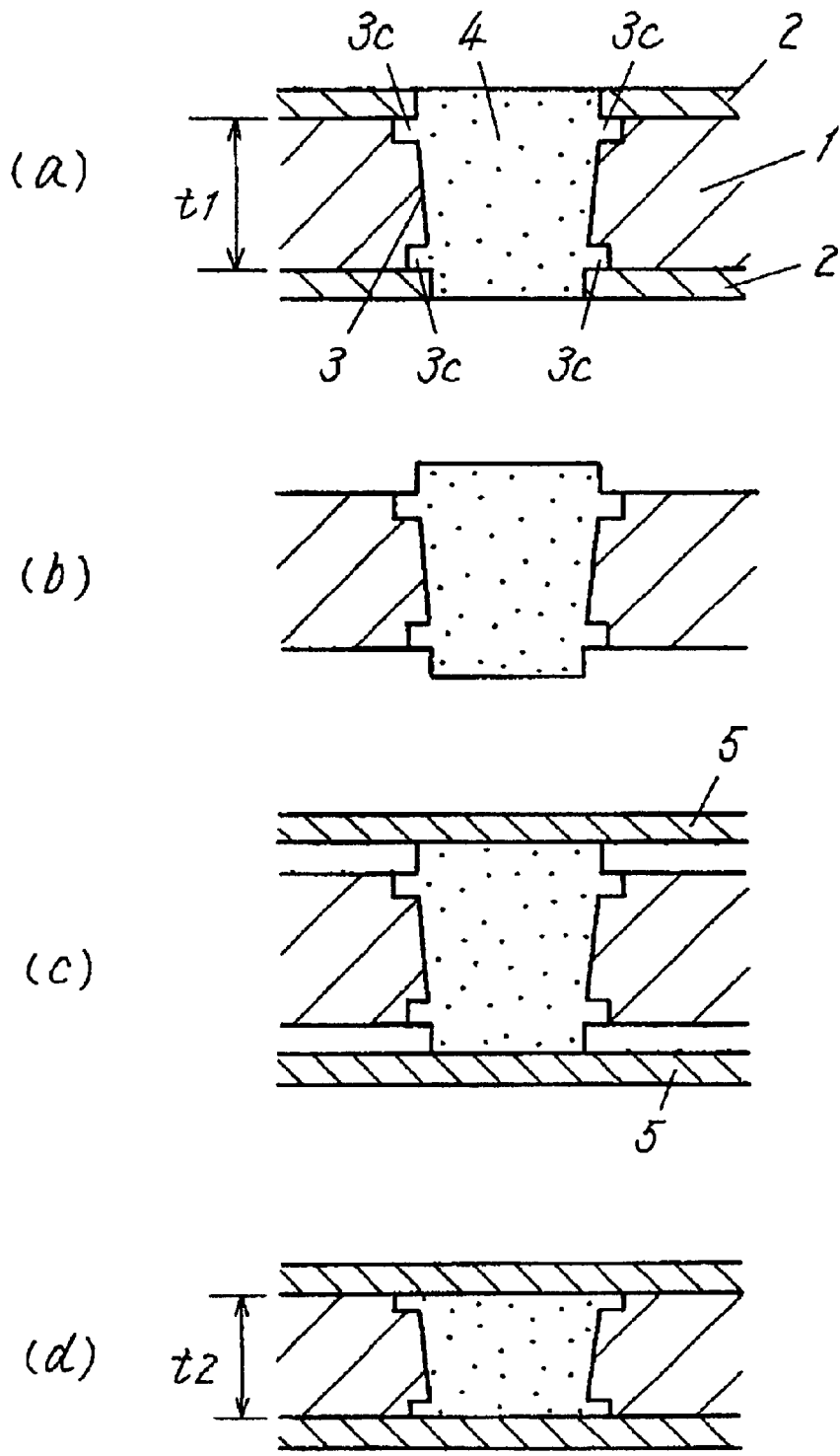
FIG. 4 shows sectional views illustrating the manufacturing process of the through-holes in accordance with a fourth embodiment of the present invention.
Figure 5:
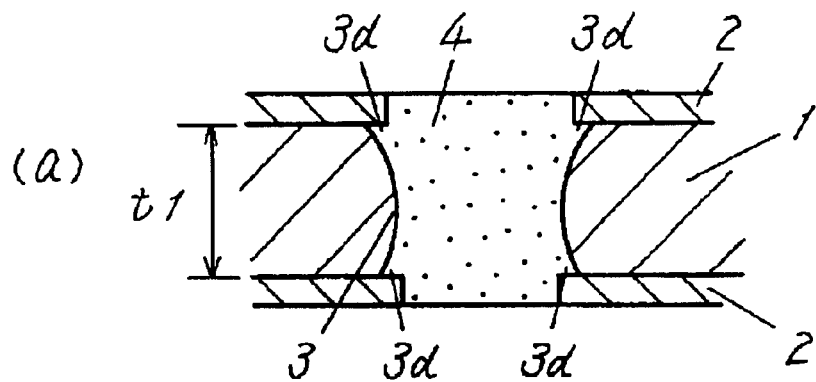
FIG. 5 shows sectional views illustrating the manufacturing process of the through-holes in accordance with a fifth embodiment of the present invention.
Figure 5:
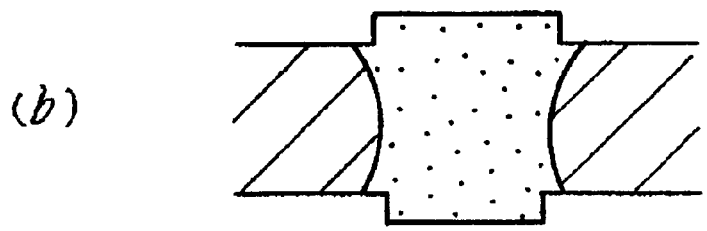
Figure 5:
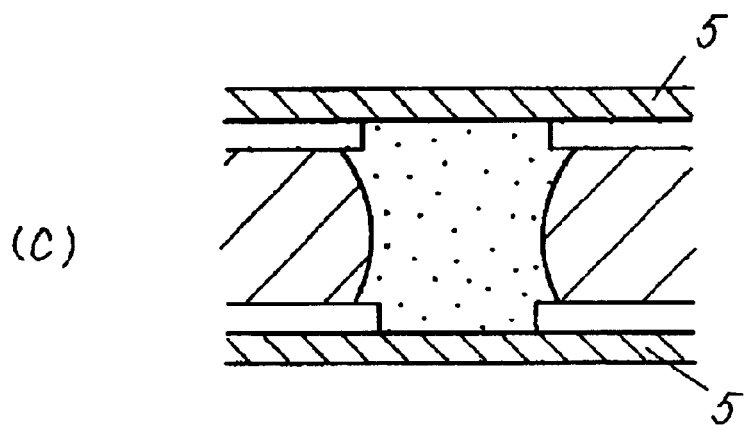
Figure 5:
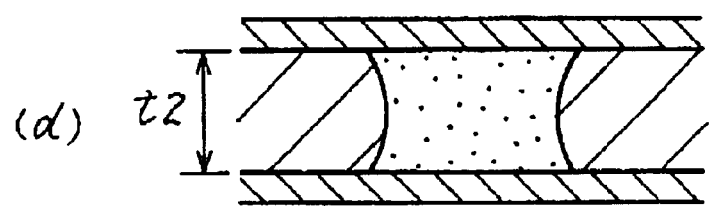
Figure 6:
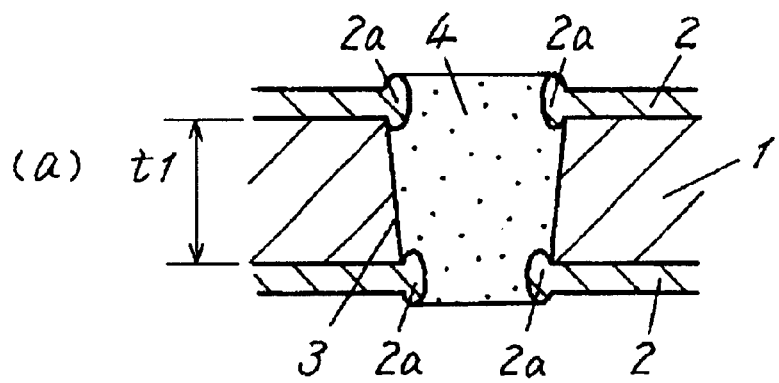
FIG. 6 shows sectional views illustrating the manufacturing process of the through-holes in accordance with a sixth embodiment of the present invention.
Figure 6:
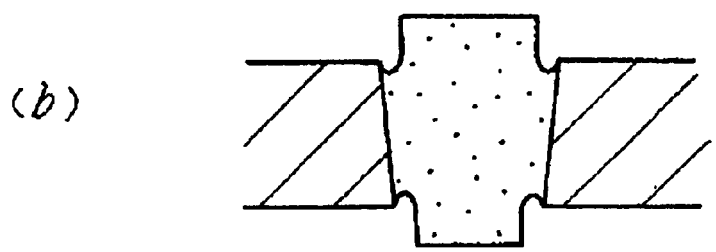
Figure 6:
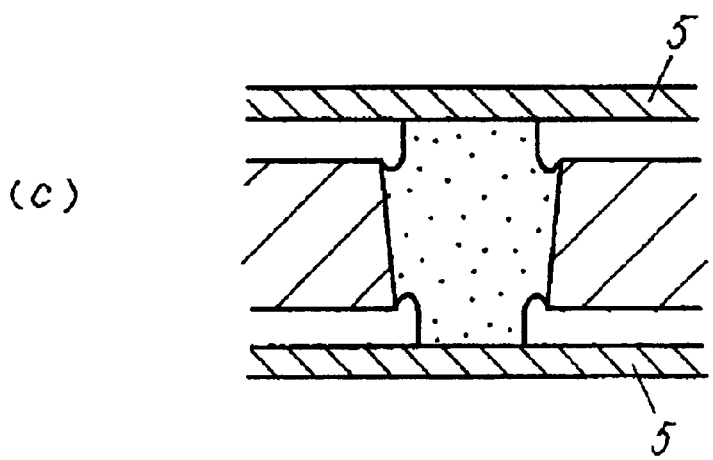
Figure 6:
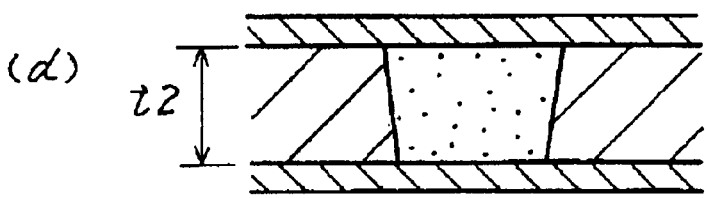
Figure 7:
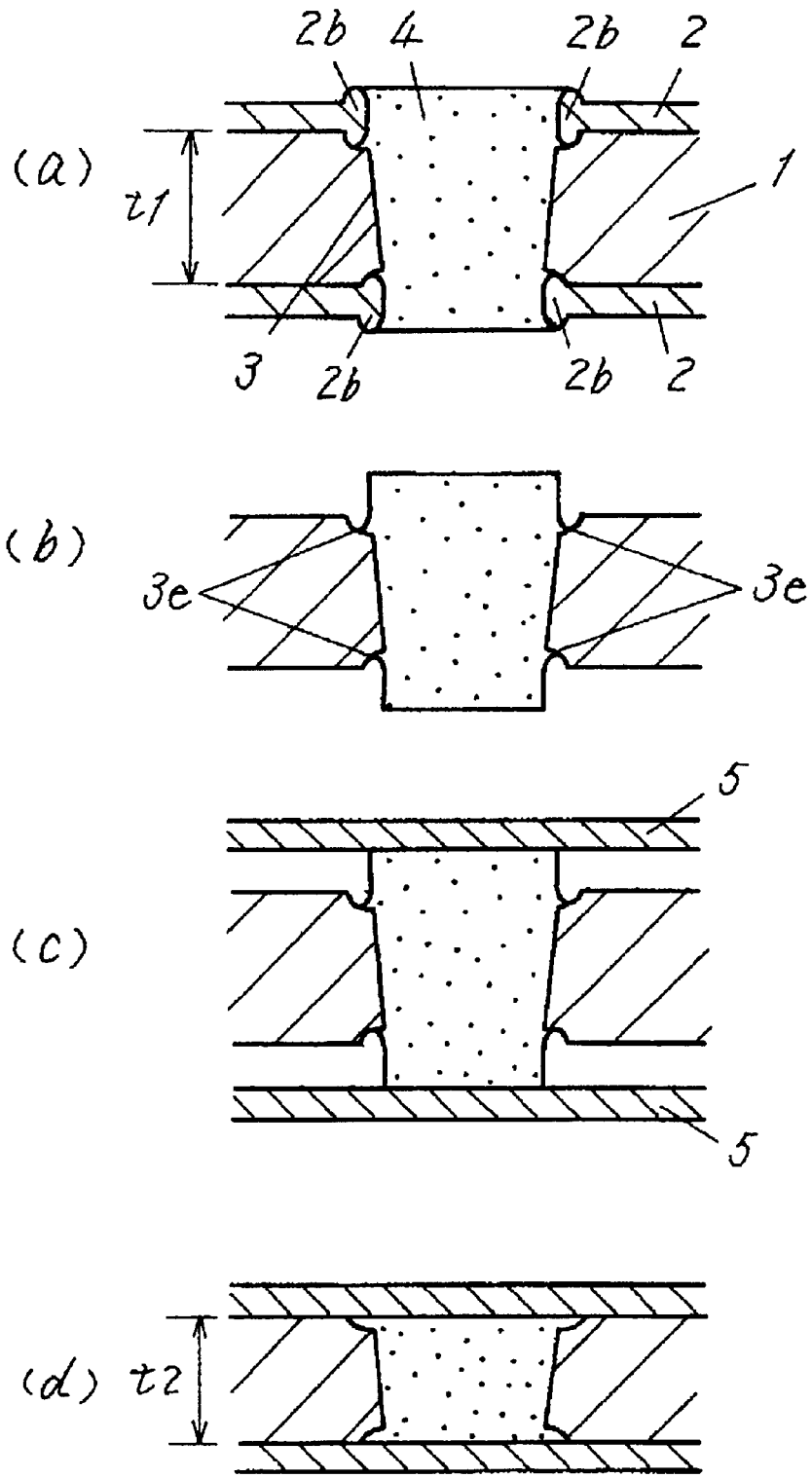
FIG. 7 shows sectional views illustrating the manufacturing process of the through-holes in accordance with a seventh embodiment of the present invention.
Figure 8:
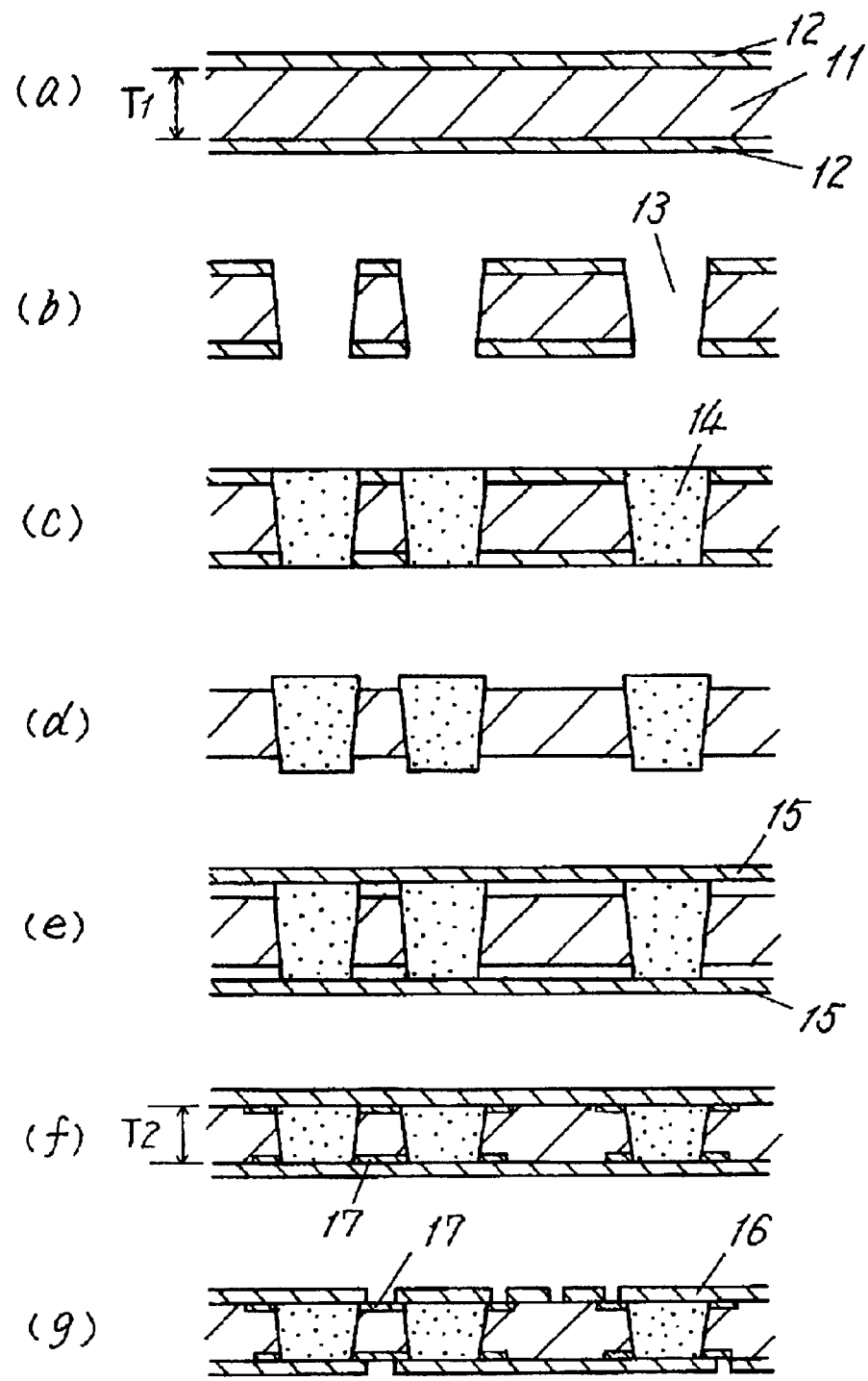
FIG. 8 shows sectional views illustrating manufacturing process of a similar kind of conventional PCB.

The preferred embodiments of the present invention are described below with reference to FIGS. 1 to 7.

The First Preferred Embodiment

FIGS. 1(a)–(g) are sectional views illustrating the manufacturing method of PCB in accordance with the first preferred embodiment of the present invention.

First, as shown in FIG. 1(a), releasing films 2 are bonded on to both faces of a prepreg 1 whose sides are 500 mm each in length and 120 μm in thickness. The prepreg 1 is a composite material produced by impregnating thermosetting epoxy resin into non-woven fabric made of aromatic polyamide fiber. The releasing films 2 are produced by forming a silicone releasing layer of about 100 Å in thickness on a polymer film made of PET (polyethylene terephthalate) 19 μm in thickness. In place of PET, PI (polyimide), PEN (polyethylene naphthalate), PPS (polyphenylene sulfide), PP(polypropylen) or PPO (polyphenylene oxide) can be used as the polymer film for the releasing films 2. Similarly, as with the prepreg 1, a composite material produced by thermosetting epoxy resin impregnated glass fiber can be used.

Second, as shown in FIG. 1(b), through-holes 3 are formed by a laser machining method at predetermined places of the prepreg 1. It is important to ensure that the diameter of the through-holes 3 be larger than the diameter of the holes formed on the releasing films 2.

To make the diameter of the through-holes 3 larger than the diameter of the holes on the releasing films 2, gel time of the B stage thermosetting epoxy resin impregnated in the prepreg 1 is shortened. To be more precise, the gel time is set at between 50 and 150 seconds. This provides the releasing films 2 formed on both faces of the prepreg 1 with holes with a diameter suitable to the diameter of the mask during the laser processing. The prepreg 1 is also provided with desirable holes, since the gel time of the thermosetting epoxy resin impregnated in the prepreg 1 is short. That is, a heat energy generated during the laser processing is dispersed in the vicinity of the predetermined holes, thus promoting curing of the resin. As resin shrinks during curing, the diameter of holes consequently becomes larger than that of the mask. The non-woven fabric used for the prepreg 1 is laser processed and provided with holes of a predetermined diameter by the laser processing. Since the non-woven fabric is drawn due to the shrinkage of the resin caused by curing, diameter of holes becomes larger than that of the holes of the mask. If the non-woven fabric is not drawn when resin is cured and shrunken, the diameter of the holes formed on the non-woven cloth may become the same as the diameter of the holes of the mask. However, since the non-woven fabric is porous, when the conductive paste 4 is filled in the through-holes 3 in the following process, the conductive paste 4 penetrates into the spaces of the porous non-woven fabric to occupy a larger area inside the prepreg 1 than the diameter of the holes formed on the releasing film 2. It is important to note that the foregoing effect can be achieved by the use of the releasing film 2 rather than liquid releasing agent.

It is also critical to ensure that the holes of the releasing film 2 be located inside the outer edges of the through-holes 3. By adjusting relative positions between and shapes of the through-holes 3 and the releasing film 2, the conductive paste 4 can be prevented from overflowing from the through-holes 3 during the subsequent heating and pressing process.

For the laser machining, such lasers as carbon dioxide laser, YAG laser and excimer laser can be used.

Third, as FIG. 1(c) shows, the prepreg 1 whose through-holes have already been processed is placed on a table of a printer (not illustrated) and the conductive paste 4 is directly printed over the releasing film 2 and filled into the through-holes 3. In this process, the top releasing film 2 acts as a printing mask and an anti-contamination member for the prepreg 1. The conductive paste 4 can be printed from either side of the prepreg 1.

Fourth, the releasing film 2 is removed from the prepreg 1. When the releasing film 2 is removed, the conductive paste 4 protrudes from the surface of the prepreg 1 as shown in FIG. 1(d).

Successively, as shown in FIG. 1(e), metal foils 4 of 18 μm in thickness made of such materials as copper is attached on both faces of the prepreg 1, followed by a compression under heat to adhere the prepreg 1 and the metal foils 5 as shown in FIG. 1(f). In this process, the prepreg 1 is compressed to 80 μm in thickness to electrically connect the metal foils 5 disposed on both faces with the conductive paste 4. Simultaneously, during this process, epoxy resin, a component of the prepreg 1, and the conductive paste 4 are cured.

Fifth, as shown in FIG. 1(g), the metal foils 5 on both faces are selectively etched to form wiring patterns 6 to complete the PCB.

As escribed above, according to the present invention, the diameter of the through-holes 3 on both faces of the prepreg 1 is larger than that of the holes of the releasing film 2, which are placed inside the edges of the through-holes 3. Thus the protrusions of the conductive paste 4 on both faces of the prepreg 1 after the releasing film 2 is removed, become smaller in diameter than the through-holes 3, and exist inside the edges of the through-holes 3. This configuration prevents the protrusions of the conductive paste 4, which are formed to reduce the connection resistance between the metal foil 5 and the conductive paste 4, from overflowing out of the through-holes 3 when the prepreg 1 is sandwiched between the metal foils 5 and compressed. According to the present invention, the conductive paste 4 is connected only to the part of the metal foil 5, which will become the predetermined wiring patterns 6 by etching in the following process, and will not be connected to other wiring patterns 6 and cause a short circuit.

Further, according to the present embodiment, by making the diameter of the through-holes smaller than 200 μm, a PCB being superior in reliability and suitable for high density wiring, which has been difficult to produce with conventional manufacturing methods, can be manufactured.

The Second Preferred Embodiment

FIGS. 2(a)–(d) show shapes of the through-holes in accordance with the second preferred embodiment of the present invention.

As shown in FIG. 2(a), edges of the through-holes 3 on the front and back faces of the prepreg 1, are processed to form border sections 3a which are ring-shaped recesses. The releasing film 2 is disposed such that it covers the border sections 3a. In this state, the through-holes 3 are filled with the conductive paste 4 in the same manner as the first preferred embodiment. Following steps are the same as those of the first preferred embodiment 1:

1) removing the releasing film 2 from the prepreg 1 (see FIG. 2(b));
2) placing the metal foils 5 on both faces of the prepreg 1 (see FIG. 2(c)); and
3) compress the laminate under heat to electrically connect the metal foils 5 on both faces with the conductive paste 4 (see FIG. 2(d)). In this process, epoxy resin, a component of the prepreg 1, and the conductive paste 4 are cured.

As thus far described, the border sections 3a located around the borders between the edges of the through-holes 3 and both faces of the prepreg 1, are processed to become ring-shaped recesses. The releasing film 2 is disposed to cover the border sections 3a. Thus the conductive paste 4, which protrudes from both faces of the prepreg 1 after the releasing film 2 is removed, becomes smaller than the diameter of the through-holes 3 on front and back faces and steadily stays inside the edges of the through-holes 3. This configuration traps the protrusions of the conductive paste 4 in the border sections 3a, and prevents them from undesirably overflowing out of the through-holes 3 when the prepreg 1 is sandwiched between the metal foils 5 and compressed. Consequently, the conductive paste 4 is connected only to the part of the metal foil 5, which will become the predetermined wiring patterns 6 by etching, and will not be connected to other wiring patterns 6 and cause a short circuit.

The Third Preferred Embodiment

FIGS. 3(a)–(d) show shapes of the through-holes in accordance with the third preferred embodiment of the present invention.

As shown in FIG. 3(a), edges of the through-holes 3, in contact with front and back faces of the prepreg 1, are chamfered to form border sections 3b. The releasing film 2 is disposed such that it covers the border sections 3b. In this state, the through-holes 3 are filled with the conductive paste 4 in the same manner as the first preferred embodiment. Following steps are the same as those of the first preferred embodiment 1:

1) removing the releasing film 2 from the prepreg 1 (see FIG. 3(b));
2) placing the metal foils 5 on both faces of the prepreg 1 (see FIG. 3(c)); and
3) compressing the laminate under heat to electrically connect the metal foils 5 placed on both faces with the conductive paste 4 (see FIG. 3(d)). In this process, epoxy resin, a component of the prepreg 1, and the conductive paste 4 are cured.

As thus far described, according to this embodiment, the edges of the through-holes 3 are chamfered to form the border sections 3b. The releasing film 2 is disposed to cover the border sections 3b. Thus the conductive paste 4, which protrudes from both faces of the prepreg 1 after the releasing film 2 is removed, can be made smaller than the diameter of the through-holes 3 on the front and back faces and steadily stays inside the circumference of the through-holes 3. This traps the protrusions of the conductive paste 4 in the border sections 3b, and prevents them from undesirably overflowing out of the through-holes 3 when the prepreg 1 is sandwiched between the metal foils 5 and compressed. Consequently, the conductive paste 4 is connected only to the part of the metal foils 5, which will become the predetermined wiring patterns 6 by etching, and will not be connected to other wiring patterns 6 and cause a short circuit.

The Fourth Preferred Embodiment

FIGS. 4(a)–(d) show shapes of the through-holes in accordance with the fourth preferred embodiment of the present invention.

As shown in FIG. 4(a), edges of the through-holes 3 of this embodiment, in contact with the front and back faces of the prepreg 1, are processed to form step-like border sections 3c. The releasing film 2 is disposed such that it covers the border sections 3c. In this state, the through-holes 3 are filled with the conductive paste 4 in the same manner as the first preferred embodiment. following steps are the same as those of the first preferred embodiment 1:

1) removing the releasing film 2 from the prepreg 1 (see FIG. 4(b));
2) placing the metal foils 5 on both faces of the prepreg 1 (see FIG. 4(c)); and
3) compressing the laminate under heat to adhere the prepreg 1 and the metal foils 5 and electrically connect the metal foils 5 placed on both faces with the conductive paste 4 (see FIG. 4(d)). In this process, epoxy resin, a component of the prepreg 1, and the conductive paste 4 are cured.

As thus far described, according to this embodiment, the edges of the through-holes 3 on the front and back faces of the prepreg 1 are processed to form the step-like border sections 3c. The releasing film 2 is disposed to cover the border sections 3c. Thus the conductive paste 4, which protrudes from both faces of the prepreg 1 after the releasing film 2 is removed, becomes smaller than the diameter of the through-holes 3 on the front and back faces and steadily stays inside the circumference of the through-holes 3. This configuration traps the protrusions of the conductive paste 4 in the border sections 3c, and prevents them from undesirably overflowing out of the through-holes 3 when the prepreg 1 is sandwiched between the metal foils 5 and compressed. Consequently, the conductive paste 4 is connected only to the part of the metal foils 5, which will become the predetermined wiring patterns 6 by etching, and will not be connected to other wiring patterns 6 and cause a short circuit.

The Fifth Preferred Embodiment

FIGS. 5(a)–(d) show shapes of the through-holes in accordance with the fifth preferred embodiment of the present invention.

As shown in FIG. 5(a), the through-holes 3 of this embodiment is processed such that a diameter of the inside of the through-hole is smaller than that of on the front and back faces of the prepreg 1. Border sections 3d of the through-holes 3, which are located at the front and back faces of the prepreg 1, are covered with the releasing film 2. In this state, the through-holes 3 are filled with the conductive paste 4 in the same manner as the first preferred embodiment. Following steps are the same as those of the first preferred embodiment 1:

1) removing the releasing film 2 from the prepreg 1 (see FIG. 5(b));
2) placing the metal foils 5 on both faces of the prepreg 1 (see FIG. 5(c)); and
3) compressing the laminate under heat to adhere the prepreg 1 and the metal foils 5 and to electrically connect the metal foils 5 placed on both faces with the conductive paste 4 (see FIG. 5(d)). In this process, epoxy resin, a component of the prepreg 1, and the conductive paste 4 are cured.

As thus far described, according to this embodiment, the through-holes 3 of this embodiment is processed such that a diameter of the inside of the through-hole is smaller than that of on the front and back faces of the prepreg 1. Furthermore, the border sections 3d of the through-holes 3, which are located at the front and back faces of the prepreg 1, are covered with the releasing film 2. Thus the conductive paste 4, which protrudes from both faces of the prepreg 1 after the releasing film 2 is removed, becomes smaller than the diameter of the through-holes 3 on the front and back faces and steadily stays inside the circumference of the through-holes 3. This configuration traps the protrusions of the conductive paste 4 in the border sections 3d, and prevents them from undesirably overflowing out of the through-holes 3 when the prepreg 1 is sandwiched between the metal foil 5 and compressed. Consequently, the conductive paste 4 is connected only to the part of the metal foils 5, which will become the predetermined wiring patterns 6 by etching, and will not be connected to other wiring patterns 6 and cause a short circuit.

The Sixth Preferred Embodiment

FIGS. 6(a)–(d) show shapes of the through-holes and the releasing film 2 in accordance with the sixth preferred embodiment of the present invention.

As shown in FIG. 6(a), in this embodiment, expanded sections 2a, which are located near the openings of the releasing film 2 formed by a laser processing, cover the circumference of the through-holes 3. To expand part of the releasing film 2, a carbon dioxide laser with high heat energy should be used. Due to the heat energy, rearrangement of molecules, which occurs along the sections exposed to the laser processing, deforms the film and triggers an expansion to form the expanded sections 2a. In this state, the through-holes 3 are filled with the conductive paste 4 in the same manner as the first preferred embodiment. Following steps are the same as those of the first preferred embodiment 1:

1) removing the releasing film 2 from the prepreg 1 (see FIG. 6(b));
2) placing the metal foils 5 on both faces of the prepreg 1 (see FIG. 6(c)); and
3) compressing the laminate under heat to adhere the prepreg 1 and the metal foils 5 and electrically connect the metal foils 5 placed on both faces with the conductive paste 4 (see FIG. 6(d)). In this process, epoxy resin, a component of the prepreg 1, and the conductive paste 4 are cured.

As thus far described, according to this embodiment, the expanded sections 2a located near the openings of the releasing film 2 formed by the laser processing, cover around the edges of the through-holes 3. Thus, after the releasing film 2 is removed, the level of the conductive paste 4 at around the edges of the through-holes 3 is recessed from the levels of both faces of the prepreg 1 while it is protruded at and around the center of the through-holes 3. This configuration traps the protrusions of the conductive paste 4 in its recesses formed around the edges of the through-holes 3 and prevents them from undesirably overflowing out of the through-holes 3 when the prepreg 1 is sandwiched between the metal foils 5 and compressed. Consequently, the conductive paste 4 is connected only to the part of the metal foils 5, which will become the predetermined wiring patterns 6 by etching, and will not be connected to other wiring patterns 6 and cause a short circuit.

The Seventh Preferred Embodiment

FIGS. 7(a)–(d) show shapes of the through-holes in accordance with the seventh preferred embodiment of the present invention.

As shown in FIG. 7(a), in this embodiment, expanded sections 2b located near the openings of the releasing film 2 formed by a laser processing cover border sections 3e between the through-holes 3 and the front and back faces of the prepreg 1. In this embodiment, the expanded sections 2b, which is formed due to shrinkage and deformation of the releasing film 2 caused by heat emitted during the laser processing, push down the front and back faces of the prepreg 1 softened by heat to form recesses of the border section 3e. This shape of the releasing film 2 can be achieved, similarly to the sixth preferred embodiment, by using a carbon dioxide laser with high heat energy. In this state, the through-holes 3 are filled with the conductive paste 4 in the same manner as the first preferred embodiment. Following steps are the same as those of the first preferred embodiment 1:

1) removing the releasing film 2 from the prepreg 1 (see FIG. 7(b));
2) placing the metal foils 5 on both faces of the prepreg 1 (see FIG. 7(c)); and
3) compressing the laminate under heat to adhere the prepreg 1 and the metal foils 5 and electrically connect the metal foils 5 placed on both faces with the conductive paste 4 (see FIG. 7(d)). In this process, epoxy resin, a component of the prepreg 1, and the conductive paste 4 are cured. As thus far described, according to this embodiment, the conductive paste 4 does not totally fill up the border sections 3e located around the edges of the through-holes 3. At around the center of the through-holes 3 is the conductive paste 4 protruding from the front and back faces of the prepreg 1. This configuration traps the protrusions of the conductive paste 4 in the unfilled part of the through-holes 3 located around their edges and prevents it from undesirably overflowing out of the through-holes 3 when the prepreg 1 is sandwiched between the metal foils 5 and compressed. Consequently, the conductive paste 4 is connected only to the part of the metal foils 5, which will become the predetermined wiring patterns 6 by etching, and will not be connected to other wiring patterns 6 and cause a short circuit.

INDUSTRIAL APPLICABILITY

As thus far described, according to the present invention, the protrusions of the conductive paste, which are formed in order to lower the connection resistance between the metal foils and the conductive paste, do not overflow out of the through-holes. The conductive paste is connected only to the part of the metal foils, which form the predetermined wiring patterns by the etching process, and do not get connected to other wiring patterns to cause a short circuit. Thus a reliable PCB suitable for high density wiring can be manufactured.

What is claimed is:

1. A method of manufacturing a printed circuit board comprising:

providing a substrate having front and back faces, said substrate comprising fibers and a thermosetting resin;

forming a through-hole in a releasing film wherein a thickness of said releasing film around edges of the through-hole is thicker than all remaining portions of said releasing film, forming a through-hole in the substrate, the through-hole in the substrate having a larger diameter than the through-hole in the releasing film;

laminating the substrate having a through-hole with a first said releasing film on the front face of the substrate and a second said releasing film on the back face of the substrate so that the through-hole in each releasing film is in axial alignment with the through-hole in the substrate;

filling the through-hole in the substrate and in the releasing films with conductive paste;

then removing said releasing films from said substrate;

then locating metal foils on the front and back faces of said substrate after removing said releasing films and making said metal foils integral with said substrate by heat pressing; and patterning said metal foils.

2. The method of manufacturing the printed circuit board of claim 1, wherein the through-hole in each said releasing film is located on an area inside said through-hole in the substrate.

3. The method of manufacturing the printed circuit board of claim 1, further comprising forming edges of said through-hole in the substrate to have a ring-shaped recess.

4. The method of manufacturing the printed circuit board of claim 1, further comprising chamfering edges of said through-hole in the substrate.

5. The method of manufacturing the printed circuit board of claim 1, further comprising forming a step in edges of said through-hole in the substrate.

6. The method of manufacturing the printed circuit board of claim 1, wherein a diameter of an inside portion of said through-hole in the substrate is made smaller than a diameter of said through-hole in the substrate at the front and back faces of said substrate.

7. The method of manufacturing the printed circuit board of claim 1, wherein the diameter of said through-hole in the substrate is not larger than 200 $\mu$m.

8. The method of manufacturing the printed circuit board of claim 1, wherein the thicker portion of said releasing film covers an edge portion of the through-hole in the substrate, and said conductive paste does not reach to the covered edge portion of the through-hole in the substrate.

9. The method of manufacturing the printed circuit board of claim 8, wherein said conductive paste fills the covered edge portion during the heat pressing process.

10. The method of manufacturing the printed circuit board of claim 1, wherein the through-hole in the substrate and the through-holes in the releasing films are formed simultaneously.

11. The method of manufacturing the printed circuit board of claim 10, wherein the through-hole in the substrate and the through-holes in the releasing films are formed by a laser processing.

12. The method of manufacturing the printed circuit board of claim 1, wherein said thermosetting resin has a gel time of between 50 and 150 seconds.

* * * * *